United States Patent
Madurawe

(10) Patent No.: US 7,312,109 B2
(45) Date of Patent: Dec. 25, 2007

(54) METHODS FOR FABRICATING FUSE PROGRAMMABLE THREE DIMENSIONAL INTEGRATED CIRCUITS

(75) Inventor: Raminda Udaya Madurawe, Sunnyvale, CA (US)

(73) Assignee: Viciciv, Inc., Santa Clara, CA (US)

( * ) Notice: Subject to any disclaimer, the term of this patent is extended or adjusted under 35 U.S.C. 154(b) by 381 days.

(21) Appl. No.: 11/102,855

(22) Filed: Apr. 11, 2005

(65) Prior Publication Data

US 2005/0181546 A1  Aug. 18, 2005

Related U.S. Application Data

(63) Continuation-in-part of application No. 10/267,484, filed on Oct. 8, 2002, now abandoned.

(60) Provisional application No. 60/397,070, filed on Jul. 22, 2002, provisional application No. 60/393,763, filed on Jul. 8, 2002.

(51) Int. Cl.
*H01L 21/00* (2006.01)
(52) U.S. Cl. .................................................. 438/138
(58) Field of Classification Search .................. 438/132
See application file for complete search history.

(56) References Cited

U.S. PATENT DOCUMENTS

| | | | |
|---|---|---|---|
| 4,240,094 A | 12/1980 | Mader | |
| 4,609,986 A | 9/1986 | Hartmann et al. | |
| 4,706,216 A | 11/1987 | Carter | |
| 4,761,768 A | 8/1988 | Turner et al. | |
| 4,870,302 A | 9/1989 | Freeman | |
| 4,873,459 A | 10/1989 | El Gamal et al. | |
| 5,343,406 A | 8/1994 | Freeman et al. | |
| 5,555,212 A * | 9/1996 | Toshiaki et al. | 365/200 |
| 5,563,526 A | 10/1996 | Hastings et al. | |
| 5,581,501 A | 12/1996 | Sansbury et al. | |
| 5,625,221 A | 4/1997 | Kim et al. | |
| 5,679,967 A | 10/1997 | Janai et al. | |
| 5,835,405 A | 11/1998 | Tsui et al. | |
| 5,844,422 A | 12/1998 | Trimberger et al. | |
| 5,943,574 A | 8/1999 | Tehrani et al. | |
| 5,949,710 A | 9/1999 | Pass et al. | |
| 5,986,319 A | 11/1999 | Huggins | |
| 6,018,476 A | 1/2000 | Madurawe et al. | |
| 6,084,803 A * | 7/2000 | Sredanovic et al. | 365/189.05 |
| 6,097,211 A | 8/2000 | Couts-Martin et al. | |
| 6,134,173 A | 10/2000 | Cliff et al. | |
| 6,240,034 B1 * | 5/2001 | Sredanovic et al. | 365/225.7 |
| 6,242,767 B1 | 6/2001 | How et al. | |
| 6,255,718 B1 | 7/2001 | Janai et al. | |
| 6,307,794 B1 * | 10/2001 | Haga | 365/200 |
| 6,331,784 B1 | 12/2001 | Mason et al. | |

(Continued)

*Primary Examiner*—Fernando L. Toledo
(74) *Attorney, Agent, or Firm*—Tran & Associates

(57) ABSTRACT

A method of fabricating a field programmable integrated circuit comprised of: constructing a semiconductor device comprising a fuse circuit to customize the logic content of a programmable logic circuit; and attaching said semiconductor device in a detachable lid package, wherein the fuses are customized in the field by detaching the lid and blowing one or more fuse elements. The said method further comprised of: providing a custom hard-wire pattern in lieu of the fuse circuit, wherein the programmable logic circuit timing is identical between the fuse circuit and hard-wire options.

20 Claims, 9 Drawing Sheets

U.S. PATENT DOCUMENTS

| | | |
|---|---|---|
| 6,331,789 B2 | 12/2001 | Or-Bach |
| 6,353,562 B2 * | 3/2002 | Bohm et al. ................. 365/200 |
| 6,448,808 B2 | 9/2002 | Young et al. |
| 6,459,136 B1 | 10/2002 | Amarilio et al. |
| 6,504,742 B1 | 1/2003 | Tran et al. |
| 6,515,511 B2 | 2/2003 | Sugibayashi et al. |
| 6,582,980 B2 | 6/2003 | Feldman et al. |
| 6,604,228 B1 * | 8/2003 | Patel et al. .................... 716/8 |
| 6,613,611 B1 | 9/2003 | How et al. |
| 6,627,985 B2 | 9/2003 | Huppenthal et al. |
| 6,934,173 B2 * | 8/2005 | Keeth et al. .................. 365/51 |
| 2001/0003428 A1 | 6/2001 | Or-Bach |
| 2001/0047509 A1 | 11/2001 | Mason et al. |
| 2002/0149987 A1 * | 10/2002 | Haeberli et al. ............ 365/226 |
| 2002/0179943 A1 * | 12/2002 | Shirai et al. ................ 257/238 |
| 2003/0023762 A1 | 1/2003 | Dhir et al. |
| 2003/0182531 A1 * | 9/2003 | Terzioglu et al. ........... 711/201 |

* cited by examiner

METHODS FOR FABRICATING FUSE PROGRAMMABLE THREE DIMENSIONAL INTEGRATED CIRCUITS

This application is a continuation in part of application Ser. No. 10/267,484 filed on Oct. 8, 2002, now abandoned which claims priority from Provisional Application Ser. No. 60/393,763 filed on Jul. 8, 2002 and Provisional Application Ser. No. 60/397,070 filed on Jul. 22, 2002, all of which have as inventor Mr. R. U. Madurawe and the contents of which are incorporated-by-reference.

This application is related to application Ser. No. 10/846,698 filed on May 17, 2004, which is a continuation of application Ser. No. 10/267,483 filed on Oct. 8, 2002, and application Ser. No. 10/267,511 filed on Oct. 8, 2002, now U.S. Pat. No. 6,747,478, all of which list as inventor Mr. R. U. Madurawe, the contents of which are incorporated-by-reference. This application is also related to application Ser. No. 10/846,699 filed on May 17, 2004 and application Ser. No. 10/988,396 filed on Nov. 15, 2004, all of which list as inventor Mr. R. U. Madurawe, the contents of which are incorporated-by-reference.

BACKGROUND

The present invention relates to methods for making multi-dimensional integrated circuits that are field programmable.

Integrated electronic circuits (ICs) are usually fabricated with pre-specified devices and internal connections which are implemented during the manufacturing process. Moreover, once a fabrication process is specified for a particular IC, the process typically is not substantially altered unless major processing errors are identified. Any changes to the particular IC design have no accompanying changes to the fabrication process. This methodology is followed in custom or semi-custom application specific integrated circuit (ASIC) devices used in high volume, low cost applications.

The design and fabrication of custom or semi-custom ICs can be time consuming and expensive. The customization involves a lengthy design cycle during the product definition phase and high Non Recurring Engineering (NRE) costs during the manufacturing phase. Further, should errors exist in the custom or semi-custom ICs, the design/fabrication cycle has to be repeated, further aggravating the time to market and engineering cost. As a result, ASICs serve only specific markets and are custom built for high volume and low cost applications.

Another type of semi custom device called a Gate Array customizes modular blocks at a reduced NRE cost by synthesizing the customer design using a software tool into the pre-defined sea of gates. Only the metallization is customized to place and route the design, reducing both the custom mask cost and time to solution. Shrinking transistor geometries and increasing levels of metal needed to connect gates have made this technique undesirable. The missing silicon level design verification results in multiple spins and lengthy design iterations. To reduce the turn around time some Gate Arrays provide fewer customizable metal levels which aggravate connectivity needed to place and route designs with timing closure. Some Gate Arrays, as disclosed in U.S. Pat. Nos. 4,240,094, 5,679,967, 5,986,319, 6,255,718 and 6,459,136, provide metal customization by connecting and/or disconnecting metal by directing pulsed laser energy. The laser process performed at wafer level incur product delivery delay and unpredictable wire to wire capacitance loading and current leakage that severely impact timing closure and signal integrity in the metal tracks.

In recent years there has been a move away from custom or semi-custom ICs towards field programmable components whose function is determined not when the integrated circuit is fabricated, but by an end user "in the field" prior to use. FPGA architectures are discussed in U.S. Pat. Nos. 4,609,986, 4,706,216, 4,761,768, 4,870,302, 4,873,459, 5,488,316, 5,343,406, 5,835,405, 5,844,422, 6,134,173, 6,239,613, 6,275,065, 6,448,808, and 6,515,511. These patents disclose specialized routing blocks to connect logic elements in FPGA's and macro-cells in PLD's. In all cases the routing block is programmed to define inputs and outputs for the logic blocks, while the logic block performs a specific logic function. They offer programmability at the point of use by the user. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to optimize silicon performance. The flexibility of this in field programmability is expensive in terms of silicon real estate, very slow in terms of performance, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late in the product design cycle. It is only for high volume production runs that there is a cost benefit in using the more traditional ASIC approaches, but the volumes are unpredictable during early stages of the product life cycle. However, the conversion from an FPGA implementation to an ASIC implementation typically requires a complete redesign. Such redesign is undesirable in that the FPGA design effort is wasted. Anytime a design is mapped from an FPGA to a structured array platform, it is still a new design with a lengthy design cycle time at a high cost to the user.

Compared to PLD and FPGA, an ASIC has hard-wired logic connections, identified during the chip design phase, and need no configuration memory cells. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost, higher performance and better reliability (ASIC advantage).

There is no convenient migration path from a PLD or FPGA used as a design verification and prototyping vehicle to the lower die size ASIC. All of the SRAM or Anti-fuse configuration bits and programming circuitry has no value to the ASIC. Programmable module removal from the PLD or FPGA and the ensuing layout and design customization is time consuming with severe timing variations from the original design.

SUMMARY

New three dimensional integrated circuits are disclosed in application Ser. Nos. 10/267,483 and 10/846,699 that provide programmable design solutions at the density and performance of gate arrays. Special configuration circuits for such circuits are disclosed in application Ser. No. 10/988, 396. Methods for fabricating such integrated circuits are disclosed in application Ser. Nos. 10/267,484 and 10/846,698. Methods to fabricate such integrated circuits using fuse elements are further disclosed in this current application.

In one aspect, a method of fabricating a field programmable integrated circuit comprises: constructing a semiconductor device comprising a fuse circuit to customize the logic content of a programmable logic circuit; and attaching said semiconductor device in a detachable lid package, wherein the fuses are customized in the field by detaching the lid and blowing one or more fuse elements.

Implementations of the above method may include one of the following. The fabricating of digital circuits may include fabricating logic blocks. The logic blocks may contain programmable logic blocks. The digital circuits may comprise memory circuits. The memory circuit may contain programmable memory to configure logic blocks to a user specification. The memory may be random access memory (RAM) or read only memory (ROM). The memory may comprise SRAM, DRAM, EEPROM, EPROM, Flash or any other kind of RAM elements. The memory may further comprise fuses, anti-fuses, metal fuses, hard-wires or any other ROM elements. The fuse elements may be programmed to implement a memory feature. The fuse elements may be programmed by thermal, electrical, mechanical, optical, vibration, thermal, chemical, magnetic, ultrasound or any other destructive method. Fuse elements may be coupled to power and ground rails to provide user selectable binary data values. A conductive pattern may be constructed as a ROM in lieu of programmable fuses to provide an identical hard-wire pattern. A generic field programmable gate array (FPGA) may be formed with programmable RAM or programmable ROM memory circuits. An application specific integrated circuit (ASIC) may be formed with the hard-wire ROM pattern. Multiple ASICs with different variations of conductive patterns may be fabricated. The memory circuit and the conductive pattern have one or more substantially matching logic control characteristics. One of the circuit characteristics includes timing characteristics, substantially unchanged by the circuit control option. Data stored in the memory circuit may be mapped to the conductive pattern by an automated software tool. A custom mask corresponding to the conductive pattern may be generated to fabricate an ASIC. The integrated circuit may be programmed and instantly verified in a printed circuit board (PCB) by the user at the application site in the field. The programming of memory may occur inside the package by electrical means. The package lid may be detached. The programming may occur electrically inside a package without a detachable lid. The programming may occur by physical means by detaching the lid. The programming may be done through a lid with a transparent window. A programmer adapted to hold a packed die may be used to program the device.

In another aspect, a method of forming a programmable semiconductor device comprises: fabricating digital circuits comprising a programmable logic circuit on a substrate; fabricating an interconnect and routing structure substantially above the digital circuits; and fabricating a programmable fuse circuit above the routing structure to program said programmable logic circuit, wherein the fuse circuit is programmed to store binary data values.

Implementations of this aspect may include fabricating a field programmable gate array (FPGA) with the fuse circuit. The fuse circuit may be located at the top of the die for easy programming by an external source. The external source may be a destructive technique that can blow the fuse element. The external source may be a thermal beam, electromagnetic radiation, optical energy beam, or a LASER beam. The external beam may blow the fuse by heating the fuse element beyond its melting point. The external beam may blow the fuse by removing the fuse material with a chemical reaction. The fuse element may leave residue that cause very low level leakage by the fuse blow technique. Implement binary memory values may prevent signal integrity of the programmable circuits. Binary memory values may have noise margins that are designed to tolerate very low fuse leakages. The fuses may be blown at the wafer testing level, prior to assembly. The fuse blow may blow the dielectric material above the fuse during the blow process. The blown dielectric may allow moisture to reach the fuse metal. After packaging detachable lid programmable products may be only required to validate designs quickly. They may be used iteratively to quickly debug designs. Once the design is verified, the fuses may be blown at wafer level, and assembled in hermatically sealed packages to prevent moisture penetration. Once the design is verified, the fuse pattern may be hard-wired by a custom mask to eliminate the fuse blowing entirely. A metal fuse is immune to data disturb by alpha particles. The fuse products and hard-wired products may be reliable for military and space applications.

In yet another aspect, a method of fabricating a programmable integrated circuit comprises: fabricating a packaged semiconductor device comprising a laser fuse circuit as the top most metal layer to customize the logic content of a programmable logic circuit. Such a method may require each programmable node in the logic circuit to be coupled to two laser fuse elements, one coupled to a power bus and the other coupled to a ground bus, to maintain signal integrity. Furthermore, such a method may require the package to comprise a detachable lid to remove the lid and facilitate fuse blow at the pint of use with an optical laser beam.

The implementation of above may include fabricating an FPGA wherein each programmable node is coupled to a pair of fuses fabricated at the top of the die. The fuses may be custom built for the sole purpose of achieving a clean and fast fuse blow. The fuses may be paired such that each programmable node is coupled to resistor device pair of fuses—one blown and one intact to power and ground. A leaky blown fuse may be 100 times more resistive than a conductive fuse. A clean blown fuse may be 1,000,000 times more resistive than a conductive fuse. The leaky fuse still provides digital logic levels well within the noise margins of programmable logic circuits. The fuses are scalable to usages comprising over 100 million fuses. The fuses may drive only high impedance programmable logic nodes. The nodes may be gate electrodes of pass-gate logic devices. The nodes may by input gates to logic inverters. The fuse may not have DC current dissipation as they charge the high impedance nodes in the logic circuits to static voltage levels. The lack of DC current through the fuse may make the fuse more reliable. The conductive fuse may not blow accidentally by electro-migration. The fuse may not blow accidentally during signal switching in the integrated circuits. The fuse may not enhance the power dissipation of the integrated circuit. A blown fuse may continue to improve its leakage current due to residue burning by the thermal generation at the very high resistive site. The fuse may be metal. The fuse may be doped poly-silicon. The fuse material may be non-corrosive. The fuse material may be Tungsten or Titanium-Tungsten layers. The fuse layer may not be shared with any other non-fuse related requirements in the integrated circuit. The fuse material may still not corrode after fuse blow during a moisture bake even if the detachable lid may not provide a hermatic seal. The fuse links may be sandwiched from above and below by plasma nitride passivation material resistant to moisture penetration.

The result of the methods provide a three-dimensional semiconductor device that includes a first module layer having a plurality of circuit blocks; and a second module layer formed substantially above the first module layer, wherein a plurality of configuration circuits are formed to store instructions to control a portion of the circuit modules. The configuration circuits comprise laser programmable memory elements. Each memory element can be configured to store a digital zero and a digital one. Each memory element may be programmed at wafer level during test or at package level during design implementation in the field. One or more redundant memory cells can be provided for controlling the same circuit block. Redundant memory cells can be mixed with non fuse based memory elements to implement security. A third module comprising interconnect and routing can be formed in between the first and second module layers. The memory elements in the second module may be coupled thru the third module to the first module to customize the programmable content. The circuit module may comprise programmable logic blocks which responds to input data signals and develops corresponding complete or partial output logic signals, and registers to store the logic signals and either outputting them to output terminals or returning them as inputs to additional programmable logic blocks. The programmable logic block can comprise passgate logic, multiplexer logic, truth table logic, look-up-table logic, AND/OR logic, inverter logic or any other logic. The fuse element may generate a control signal to regulate the logic block.

Advantages of the methods may include one or more of the following. A very small FPGA die size achieved with vertical programmability. A significant cost and performance benefit in the FPGA is achieved by the area reduction. A simple turn-key design conversion technique is realized from the FPGA to the ASIC. Greatly enhanced time to market, low cost and better reliability is provided. The IC product is field programmable. The IC product is one time field programmable in its initial FPGA stage providing time to market and early prototyping advantages. The IC product is converted to a low cost ASIC with substantially matching timing and low NRE costs when the volumes grow. The IC has the end ASIC cost structure and FPGA programmability. The IC product offering occurs in two phases: the first stage is a generic FPGA that has programmability comprised of a programmable fuse module, and the second stage is an ASIC with the entire programmable module replaced by a customized hard-wire pattern. A series product families can be provided with a modularized programmable element in an FPGA version followed by a turnkey custom ASIC with the same base die with a custom mask. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASICs in cost.

DESCRIPTION

Figure 1A:
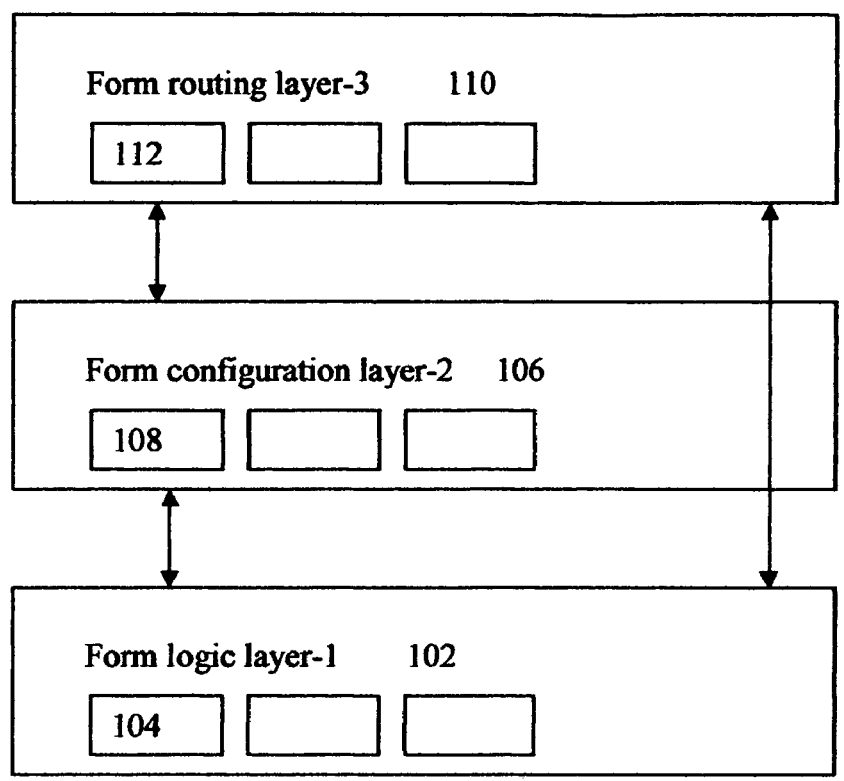
FIGS. 1A-1D shows various embodiments of a process for forming a three-dimensional (3D) IC.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term module layer includes a structure that is fabricated using a series of predetermined process steps. The boundary of the structure is defined by a first step, one or more intermediate steps, and a final step. The resulting structure is formed on a substrate.

The term configuration circuit includes one or more configurable elements and connections that can be programmed for controlling one or more circuit blocks in accordance with a predetermined user-desired functionality. The configuration circuit generates a control signal, which is received at a regulatory node in the programmable circuit. The programmable circuit is configured by the state of the control signal. In one embodiment, the configuration circuits include a plurality of memory circuits to store instructions to configure an FPGA. In another embodiment, the configuration circuits include a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate.

FIG. 1A shows a process for fabricating a first embodiment of an integrated circuit. The process allows the user to specify whether the IC is an FPGA or an ASIC. The process 100 forms a three-dimensional semiconductor device. The process 100 includes forming a first module layer 102 with a plurality of circuit blocks 104 embedded therein. The process 100 also includes forming a second module layer 106 substantially above the first module layer 102. One or more configuration circuits 108 are formed in 106 to store instructions to control a portion of the circuit blocks 104. The process 100 then forms wiring/routing circuits on a third module layer 110 above the second module layer 106. Module layer 110 has one or more circuits 112 connecting to both circuits 104 and 108 to complete the functionality of the PLD.

Figure 1B:
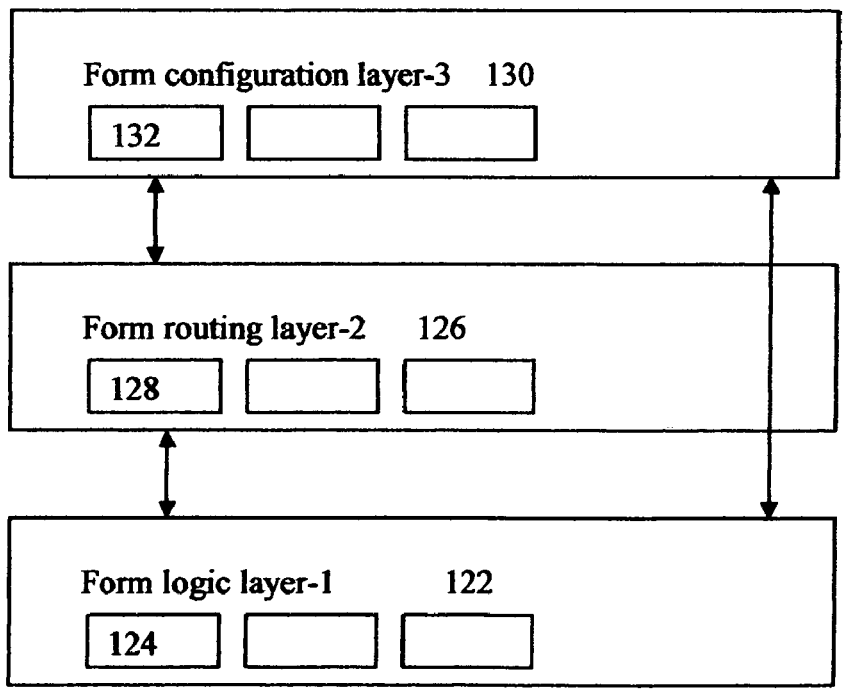

FIG. 1B shows a process 120 for fabricating a second embodiment of a 3D integrated circuit that can be either an FPGA or an ASIC. The process 120 includes forming a first module layer 122 having a plurality of circuit blocks 124 embedded therein. The process 120 also includes forming a second module layer 126 formed substantially above the first module layer 122 that includes wiring and/or routing circuitry 128. Next, the process 120 forms a third module layer 130 substantially above the second module layer 126 that includes configuration circuits 132. The wiring/routing circuitry 128 connects to the circuit blocks 124 and to configuration circuits 132. The configuration circuits 132 store instructions to control a portion of the circuit blocks 124.

Figure 1C:
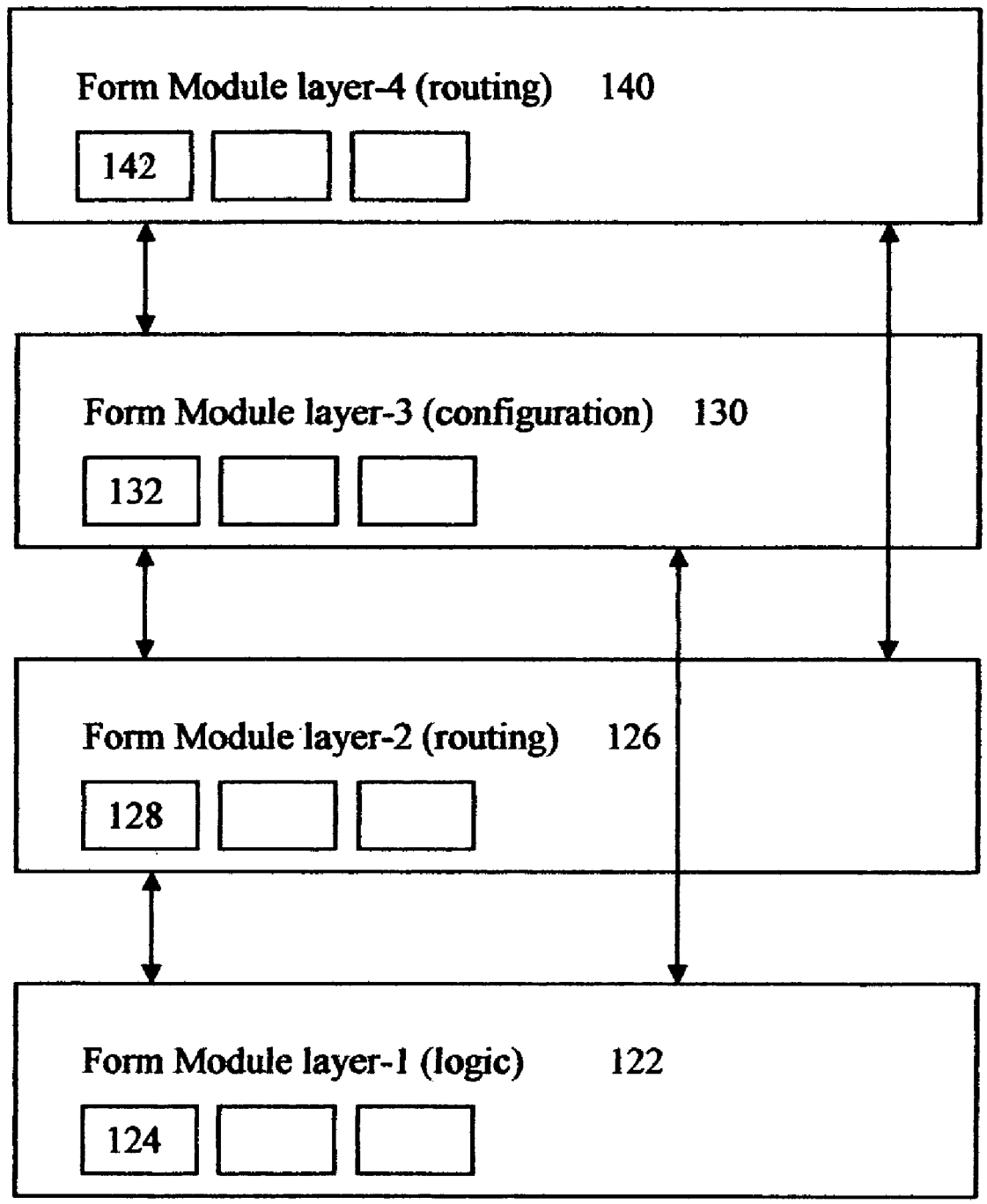

FIG. 1C shows a third process which extends the process shown in FIG. 1B. In the embodiment of FIG. 1C, the process deposits a fourth module layer 140 having wiring/routing circuitry 142 positioned above the third module layer 130. The wiring/routing circuitry 142 is electrically connected to one of the following: one or more circuit blocks 124, one or more wiring/routing circuitry 128, and one or more configuration circuits 132.

Figure 1D:
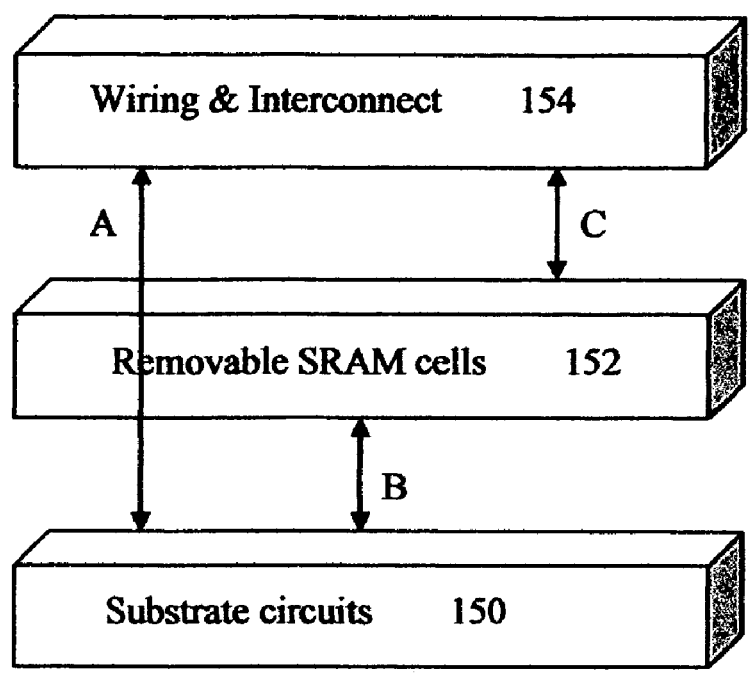

FIG. 1D shows one implementation where the configuration memory element is SRAM. First, silicon transistors 150 are deposited on a substrate. A module layer of removable SRAM memory cells 152 are positioned above the silicon transistors 150, and a module layer of interconnect wiring or routing circuit 154 is formed above the removable memory cells 152. To allow this replacement, the design adheres to a hierarchical layout structure. As shown in FIG. 1D, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc (power) and Vss (ground) wires. Most of the replaceable programmable elements and its configuration wiring is in the "replaceable module" while all the devices and wiring for the end ASIC is outside the "replaceable module". In other embodiments, the replaceable module could exist between two metal layers or as the top most layer satisfying the same device and routing constraints.

Figure 2:
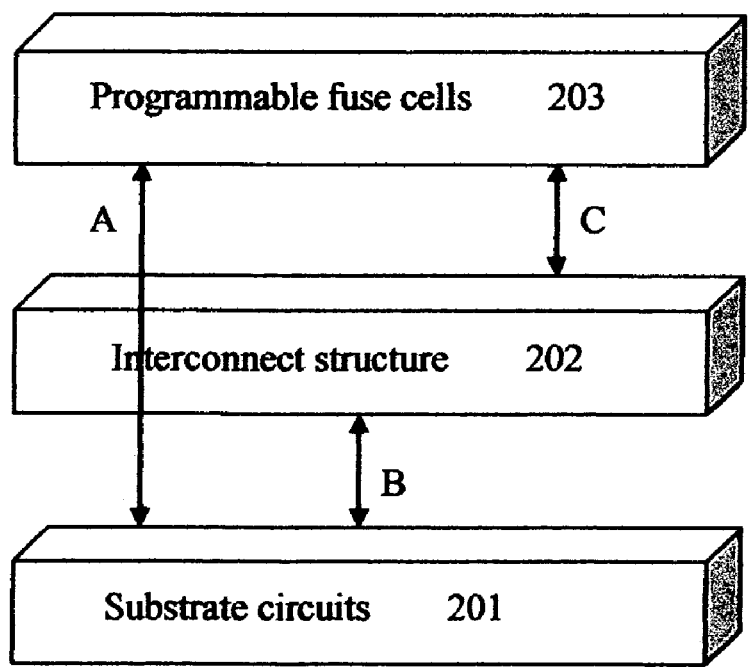
FIG. 2 shows the embodiment in FIG. 1B comprised of fuses.

FIG. 2 shows the configuration shown in FIG. 1B wherein the configuration memory element is a fuse element. First, silicon transistors 201 are formed in a first module comprising a substrate. A second module layer of interconnect wiring and routing circuit 202 is formed above the transistors 201. A third module layer of programmable fuse cells 203 are positioned above the wiring structure 202. The entire structure in FIG. 2 may be a monolithic structure, or a multi-chip module structure. Transistors 201 in module 1 comprise programmable nodes, said nodes configured by the fuse circuits 203 in module 3. To allow this programmability, thru connections A are provided. The integrated circuit design shown in FIG. 2 adheres to a hierarchical layout structure. The interconnect structure 202 is sandwiched between the transistor 201 layers below and the fuse 203 layer above electrically connecting to both. The fuse module 3 contains no switching electrical signal routing inside the module. All such routing is in the modules 1 and 2 below. Most of the fuse configuration signals run inside the module 3. In one preferred embodiment, fuse module connections to interconnect module "C" are minimized to Power and Ground wires. Connections "B" between interconnect module 2 and transistor module 1 comprise all logical net connects of the integrated circuit, excluding the configuration signals to program module 1. Fuse circuits in module 3 can be replaced by a mask programmable metal pattern. Fuse circuit in module 3 may store a memory pattern, said memory pattern may be provided by fuses coupled to power and ground buses. The power and ground buses may be in the fuse module 3, or may be in the interconnect structure module 2. The replaceable fuse elements and its configuration wiring is in the "replaceable module" while all the devices and wiring for the end ASIC is outside the "replaceable module".

Fabrication of the IC also follows a modularized device formation. Formation of transistors 201 and routing 202 is by utilizing a standard logic process flow used in the ASIC fabrication. Extra processing steps required for fuse element 203 formation are added to the logic flow after circuit layer 202 is constructed. Such semiconductor devices fabricated by different processing options are disclosed in application Ser. No. 10/864,092, filed on Jun. 8, 2004, and lists as inventor Mr. R. U. Maturate, the contents of which are incorporated-by-reference.

During the customization, the base die and the data in those remaining mask layers do not change making the logistics associated with chip manufacture simple. Removal of the fuse module provides a low cost standard logic process for the final ASIC construction with the added benefit of a smaller die size. The design timing is unaffected by this migration as lateral metal routing in module 2 and silicon transistors in module 1 are untouched (FIG. 2). Software verification and the original FPGA design methodology provide a guaranteed final ASIC solution to the user. A full disclosure of the ASIC migration from the original FPGA is in the incorporated by reference applications discussed above.

In yet another embodiment of a programmable multi-dimensional semiconductor device, a first module layer is fabricated having a plurality of circuit blocks formed on a first plane. The programmable multi-dimensional semiconductor device also includes a second module layer comprising interconnect and routing structure formed on a second plane. A plurality of configuration circuits is then formed in a third plane to store instructions to control a portion of the circuit modules. In one embodiment, the configuration circuits comprise fuse elements, said fuse elements programmable to store a memory function. The fuse programming may be achieved by one of many programmable methods such as electrical, thermal, mechanical, and optical and many other methods.

Figure 3A:
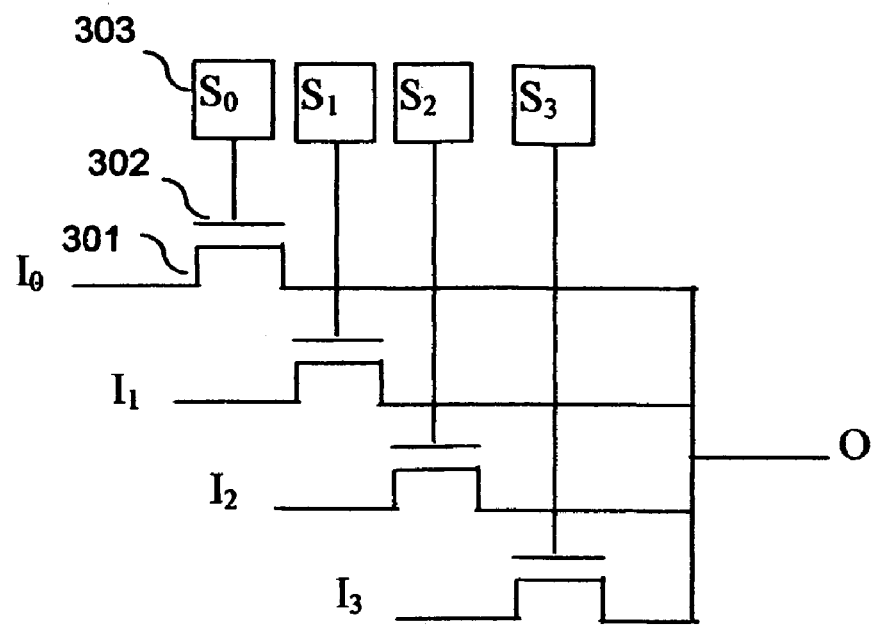
FIG. 3A shows a 4:1 programmable multiplexer comprised of memory elements.

In PLDs and FPGAs the memory data is used to generate a control signal that controls logic. The memory may be random access memory (RAM) or read only memory (ROM). A RAM memory commonly used is SRAM memory. An SRAM memory element comprises a latch, wherein the data can be flipped between logic zero and logic one by the user. The output of the latch generates a control signal. The control signal terminates on a regulatory node of a programmable logic circuit. In a preferred embodiment, the regulatory nodes are confined to high impedance nodes. High impedance nodes do not consume power as the nodes are charged to a static state at power up. In a second embodiment, the regulatory node may require a large drive current that can drive a signal to a pre-determined voltage level. Pass-gates of logic transistors comprise high impedance nodes. Inputs to inverters are also high impedance nodes. A conventional four-input programmable MUX logic circuit is shown in FIG. 3A. In that, the output O can be programmed to couple to any one of four inputs $I_0$, $I_1$, $I_2$ and $I_3$ by selecting the memory data $S_0$, $S_1$, $S_2$ and $S_3$ in the four SRAM latches 303. The pass gates 301 couples input $I_1$ to output O. The gate terminal 302 of the pass-gate 301 is a high impedance node. It is powered to either Vcc (logic one, or power) or Vss (logic zero, or ground) voltage levels. The latch 303 has an output which is at logic one or logic zero. Thus by selecting one of the latches to output a logic one, and remaining three to output logic zero, the MUX is programmed.

Figure 3B:
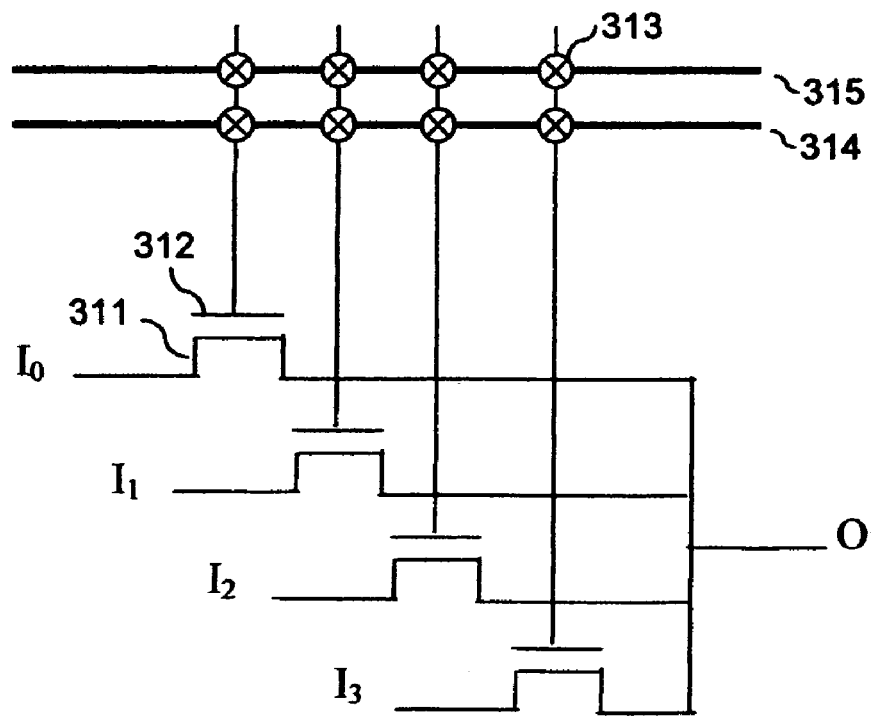
FIG. 3B shows the 4:1 multiplexer in FIG. 3A constructed with programmable fuses.

The identical feature of a conventional MUX shown in FIG. 3A is provided by programmable fuse connections as shown in FIG. 3B. Each pass-gate 311 has a high impedance gate node 312 which is programmed to a logic zero or logic one by the fuse elements such as 313. One fuse element couples node 312 to bus 315 (say power or Vcc) and another fuse element couples node 312 to bus 314 (say ground or Vss). The voltage levels on bus 314 and 315 can be selected to fit the needs of an application. In binary logic, they represent binary voltage levels. The pass-gates 311 and the gate terminals 312 in FIG. 3B belong to module 1 shown in FIG. 2. The fuse elements 313 in FIG. 3B belong to module layer 3 in FIG. 2. The wiring and signals that couple inputs I to output O belongs to interconnect module 2 in FIG. 3.

In FIG. 3B, the fuses hold logic levels 0 & 1 on NMOS gates and have no stringent requirements on the consistency of drive current strengths from fuse cell to fuse cell. For a PLD conversion to ASIC, after the logic pattern is finalized and permanent fuse data is frozen, the fuse module is replaced with a hard-wire module. This hard-wire module may be integrated into the interconnect module 2 in FIG. 2. This technology provides a frame work for modular substitution to make PLDs for prototyping and low volume production, and ASICs for high volume production. Such simplification allows replacing complex fuse processing (including programming) with simple metal contacts or wire processing. Prototyping IC's consists of programmable fuse module, and the production volume IC's consists of metal module. Thus high density, low cost PLD & ASIC designs can be done as taught herein.

Figure 4A:
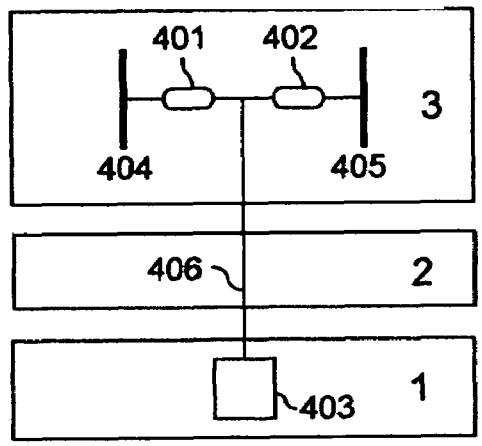
FIG. 4A shows a first embodiment of a 3-dimensional fuse circuit.

A first embodiment of constructing the fuse module layer shown in FIG. 2 is shown in FIG. 4A. In FIG. 4A, the first module layer comprises a regulatory node 403 that receives a control signal 406 from a fuse circuit in module 3. The regulatory node may be a high impedance pass-gate such as 312 shown in FIG. 3B. The fuse circuit comprises fuse elements 401 and 402 coupled to buses 404 and 405 respectively. By programming one of the two fuses to blow, and retaining the other, the regulatory node may be coupled to bus 404 or bus 405. As the two fuses provide a resistor divider between the two voltage levels, the voltage level at the regulatory node is determined by the intact fuse link resistance (Ron) and the blown fuse resistance (Roff) ratio. If this ratio (Ron/Roff) is in the 1000 to 100,000 range, the regulatory nodes can be held to within 0.001% to 0.1% of the bus voltage levels. The performance of the programmable circuit at the regulatory node comprises a noise margin well within these fuse blow variations. Thus these circuits are insensitive to blown fuse resistance variations, or the leakages at the blown fuse site. Furthermore, the fuses do not link signal wires in module 2, and has no timing impact on the circuit. In FIG. 4A, the bus wires 404 and 405 are also in the fuse module 3. This method requires only one extra metal layer to construct fuses above the digital circuits included in modules 1 & 2.

Figure 4B:
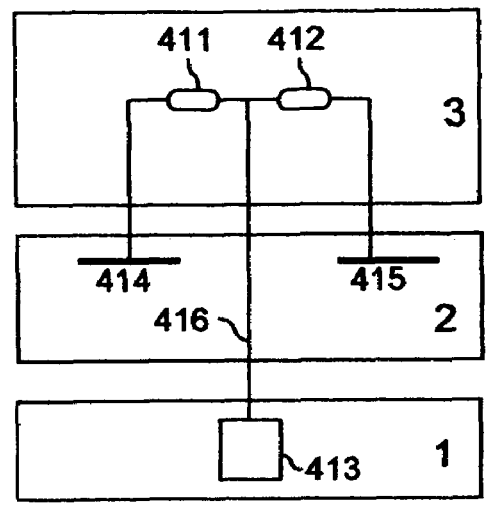
FIG. 4B shows a second embodiment of a 3-dimensional fuse circuit.

A second embodiment of constructing the fuse module layer shown in FIG. 2 is shown in FIG. 4B. In FIG. 4B, the first module layer comprises a regulatory node 413 that receives a control signal 416 from a fuse circuit in module 3. The regulatory node may be a high impedance pass-gate such as 312 shown in FIG. 3B. The fuse circuit comprises fuse elements 411 and 412 coupled to buses 414 and 415 respectively. By programming one of the two fuses to blow, and retaining the other, the regulatory node may be coupled to bus 414 or bus 415. As the two fuses provide a resistor divider between the two voltage levels, the voltage level at the regulatory node is determined by the intact fuse link resistance (Ron) and the blown fuse resistance (Roff) ratio. If this ratio (Ron/Roff) is in the 1000 to 100,000 range, the regulatory nodes can be held to within 0.001% to 0.1% of the bus voltage levels. The performance of the programmable circuit at the regulatory node comprises a noise margin well within this fuse blow variations. Thus these circuits are insensitive to blown fuse resistance variations, or the leakages at the blown fuse site. Furthermore, the fuses do not link signal wires in module 2, and has no timing impact of the circuit. In FIG. 4B, the bus wires 414 and 415 are also in the interconnect module 2. This method requires only one extra metal layer to construct fuses above the digital circuits included in modules 1 & 2, but may require an extra metal layer to construct bus lines 414 and 415 in module 2.

Separating bus lines from fuses, the fuses can be arranged in a far greater pitch to make the programming step easier.

Figure 5:
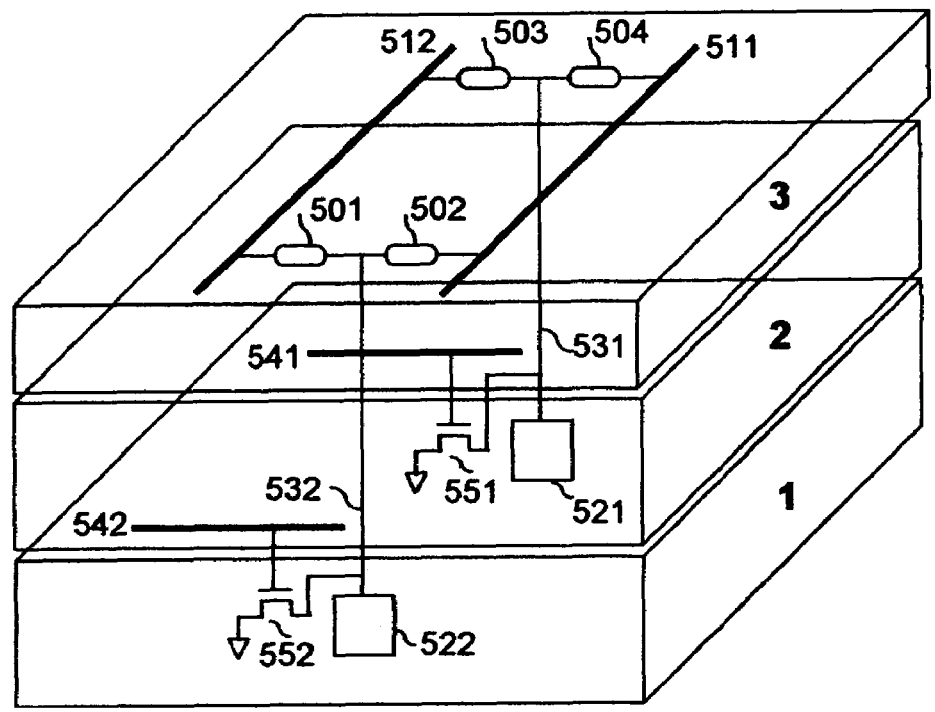
FIG. 5 shows a third embodiment of a fuse circuit.
Figure 6:
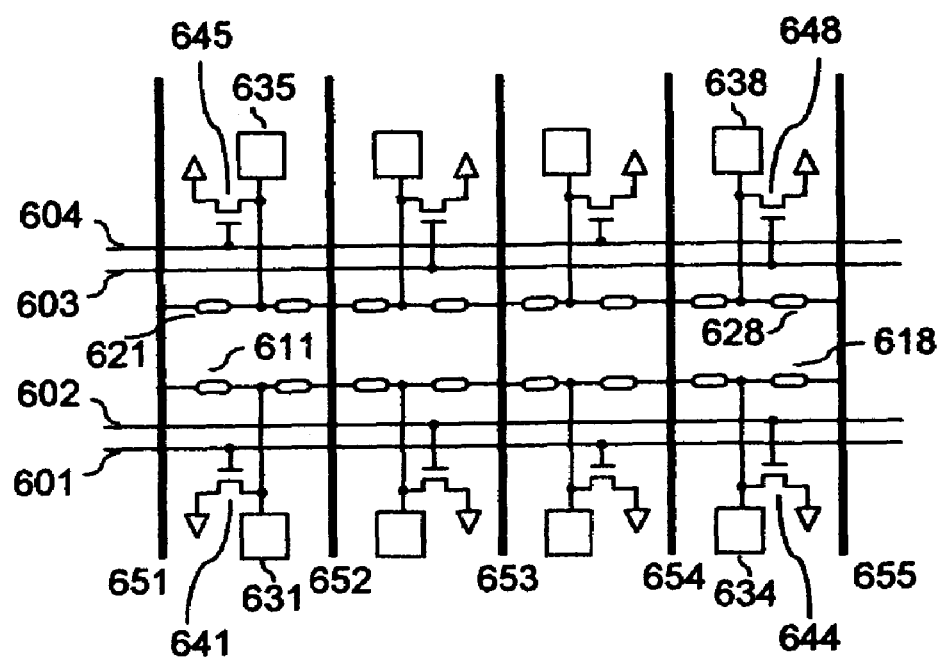
FIG. 6 shows the decoding circuit for the fuse circuit in FIG. 5.

An electrically programmable fuse adaptation of FIG. 4A or FIG. 4B is shown in FIG. 5. In FIG. 6, there are three module layers 1, 2 and 3 stacked one above the other as shown. The first module layer comprises digital circuits, wherein a portion of said digital circuits are programmable. The programmability is achieved by control signals 531 and 532 received at regulatory nodes 521 and 522 respectively. Regulatory nodes 521 and 522 are located in the first module layer. Control signals 531 and 532 are generated in the third module layer, and traverse the second module layer to terminate at the regulatory nodes. Fuses 501-504 are provided to selectively program the regulatory nodes to either logic one or logic zero states. The fuses 501 and 503 couple regulatory nodes to bus 512, and fuses 502 and 504 couple the regulatory nodes to bus 511. Bus 512 may be a power bus, while bus 511 may be a ground bus. Thus blowing fuse 501 and keeping fuse 502 intact couples regulatory node 522 to bus 511. Similarly, blowing fuse 502 and keeping fuse 501 intact couples node 522 to bus 512. The programmable method comprises selectively blowing the desired fuses from the fuse bank 501-504 shown in FIG. 5. In a first embodiment, in accordance with FIG. 4A, the bus lines 511 and 512 may be located in module 3 with the fuses 501-504. In a second embodiment, in accordance with FIG. 4B, the bus lines 511 and 512 may be located in module 2 with the interconnect structure. To program the desired fuse, decode circuitry is provided. In the shown embodiment, the decode circuitry comprises of pass transistors 551, 552 and decoding wires 541, 542. The decoding wires 541 and 542 are located in the second module, while the transistors 551 and 552 are located in the first module. The wires 511, 512 are parallel to each other. Wires 541, 542 are also parallel to each other. However, wires 511, 512 are orthogonal to wires 541, 542. This orthogonality provides a decoding method to selectively blow the desired fuse. By applying a high voltage to bus 512 and applying Vcc (power) to line 542, transistor 552 is turned to ON state, facilitating a high current flow from high voltage line 512 through fuse 501 through wire 532 through ON transistor 552 to ground. This high current will cause a resistive heating of the fuse element above its melting point and disintegrate the fuse. To allow high current flow to the fuse without loss of voltage, bus lines 511, 512 can be designed with thicker and wider metal lines, while fuses 501-504 can be designed with thinner and narrower metal links. Furthermore, the fuse material can be selected for optimal fuse blow.

The orthogonal arrangement of electrically programmable fuses is illustrated in FIG. 6. In FIG. 6, the decoding wires 601-604 run in a first direction. The bus wires 651-655 run in a second direction, said second direction orthogonal to said first direction. Decoding wires are located in the second module shown in FIG. 5, while the bus lines providing power and ground may be located in either the second module, or the third module as discussed in FIGS. 4A and 4B respectively. The fuses 611-618 and 621-628 are formed in a regular array, in pairs. The fuse material and geometry can be selected for optimal fuse blow conditions. Regulatory nodes 631-638 are located in the first module layer. They are coupled to decoding devices 641-648 to offer individual electrical programmability to the fuses. Selecting one of bus lines 651-655 and one of decoding lines 601-604, a unique fuse can be selected to conduct a high current. When this current is sufficiently high, the fuse will heat up and blow. Although one embodiment of a programmable circuit is shown in FIG. 6 to discuss the merits of selectively programming an array of fuses, one familiar with general art may construct many other alternative circuits to selectively blow the fuses. After the fuses are blown, each of the regulatory nodes 631-638 receives either logic one or logic zero control signal. Thus a memory pattern is implemented to a user specification in the array of fuses shown in FIG. 5 or FIG. 6.

Figure 7A:
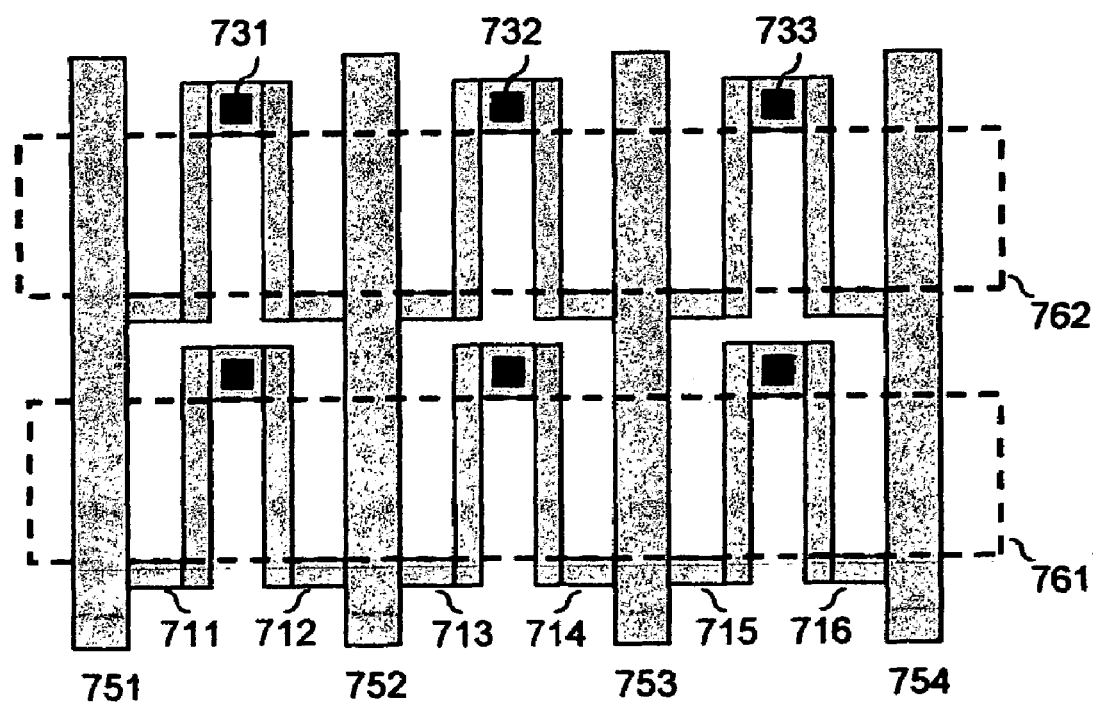
FIG. 7A shows a first embodiment of a laser programmable fuse circuit.

A first embodiment of a laser programmable fuse pattern is shown in FIG. 7A. In that, fuse elements are shown as 711-716, and bus lines are shown as 751-754. Both fuse elements and bus lines are located in module 3 as depicted in FIG. 4A. The thru connecting nodes from module 3 to the regulatory nodes in module 1 are shown as 731-733. The regulatory nodes are not shown in FIG. 7A. The fuse elements such as 711-716 are programmed by a laser beam. Impingement of laser radiation at the selected fuse site heats up the metal and blows the fuse. The laser beam traverses the center of the tracks 761 and 762 shown in FIG. 7. Each regulatory node is coupled to a pair of fuses, and one of the two fuses is blown to program the node to a user specified value (digital level one, or digital level zero). The fuse geometry such as width, thickness, length, space to next fuse and the dielectric thickness above are parameters that are optimized to improve fuse blow characteristics. Either a single laser beam or a plurality of laser beams may traverse the center of fuse tracks 761, 762 to implement a desired fuse blow pattern. A plurality of laser beams reduces the time required to program the entire device. The wavelength of the laser beam may be chosen to best blow the fuses, and to minimize damage in the underlying structure. This wavelength may be in Infra-Red spectrum or Ultra-Violet spectrum or in any other radiation energy spectrum. The focused laser beam comprises an hour glass type profile, with the narrowest portion in the beam focused at the blowing fuse link center. As the distance below the fuse increases, the laser beam energy is no longer focused and the physical disruption is reduced. Furthermore, thinner metal fuses on top of thicker and wider metal lines will further ensure that only the thin fuse at the focal point of laser beam would receive adequate energy to blow, while the defocused laser beam impinging upon the metal underneath the fuses would not be damaged. On modern day integrated circuits comprised of 6 to 9 layers of metal in module 2 (interconnect structure), the laser beam would be totally defocused by the depth and blocked by metal in its path to prevent any transistor damage in module 1 due to the laser radiation. Thus the position of these fuses with respect to either the metal lines in the interconnect structure, or transistors in the substrate is not an important parameter.

Figure 7B:
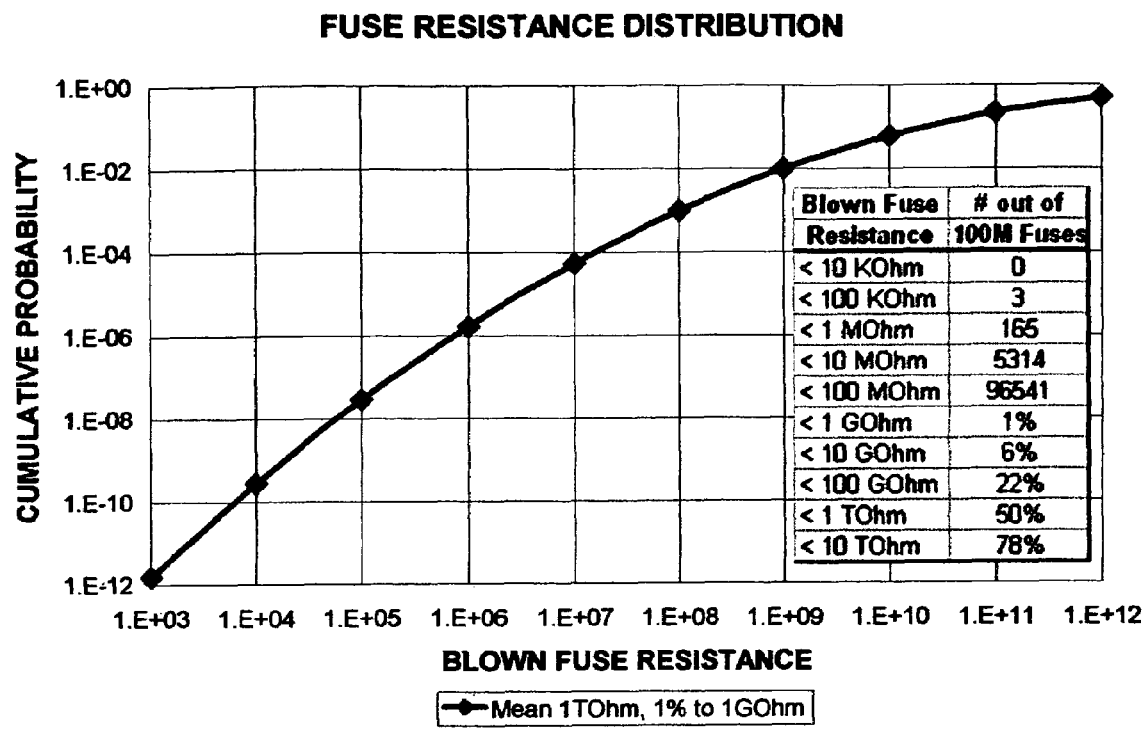
FIG. 7B shows a cumulative probability plot of a fuse resistance distribution resulting from laser programming of metal fuses.
Figure 7C:
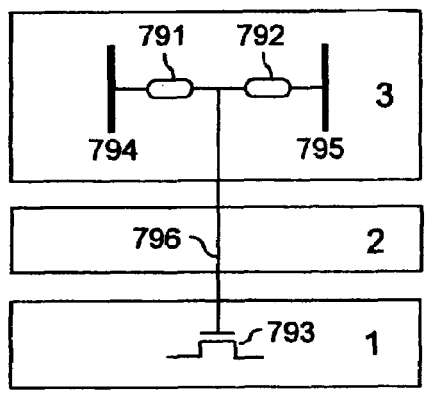
FIG. 7C shows the resistor divide construction of fuse pairs to control programmable logic nodes.

Laser programmable techniques have been used to blow connecting fuses between pre defined long wires. A fundamental weakness with this technique is the sensitivity to signal delay in the long wires due to ensuing leakage current from an improperly blown fuse site. For example, if a high impedance wire having 100 fempto-farad total capacitance had a leakage path of 1 micro-amp at a leaky blown fuse site, a transient signal in that wire can have a signal push out that is unacceptable. If the leakage is 100 μA, the wire may incur a stuck at high or stuck at low defect. Such unpredictable timing push out and stuck at defects are inappropriate in modern IC applications wherein software tools extract timing parameters to place and route complex designs. For a 1V supply voltages, 1 μA leakage can occur from 1 Meg-ohm blown fuse resistance, while a 100 μA leakage can occur from a 10 KOhm leakage path, both statistically probable in a laser system. Blown fuse resistance from a laser process may assume a log-normal cumulative probability distribution having a target mean value, and a laser process dependant standard deviation. Such a plot is shown in FIG. 7B for a top of the line laser system with a mean resistance value of 1 Tera-Ohm, and a standard deviation of 19.5 Ohms. Under these conditions, the 50% distribution point is at 1 TOhms, while the 1% distribution point is at 1 MOhms. The instep in FIG. 7B shows how many fuses fall into each band of fuse resistances if 100M fuses are blown with such a laser system. For example, there will be 3 fuses that blow to a fuse resistance between 10 KOhm and 100 KOhm. For a 1V power supply, each such leakage path will have between 10 µA to 100 µA of leakage current. These laser fuse techniques are only useful when the numbers of fuses are under 1000 total fuses, and when a 99% yield is acceptable. Such schemes are often used in the industry for redundancy implementations, and are not scalable to 1-100 million fuse ranges. In comparison, the laser fuse programmable circuit shown in FIG. 7C has the resistor divide between the rails 794 and 795 by laser fuses 791 and 792 respectively. The resultant voltage is coupled to the gate electrode of transistor 793. The transistor 793 in module-1 may be a programmable pass-gate logic element, or any other programmable high impedance node. Fuse power rail 794 may be at voltage Vcc, while fuse ground rail 795 may be at Vss. The transistor 793 may be a low voltage NMOS device comprising a threshold voltage of 0.3 volts, and operating at 1.2V logic voltage level. The fuse Vcc rail 794 may be chosen at 1.6V, higher than the logic power voltage. The intact fuse resistance may be under 100 Ohms, while the worst blown leaky fuse resistance from FIG. 7B may be 10 KOhms. If fuse 791 is blown and fuse 792 is intact, the voltage on the thru post 796 is Vcc/101=0.015V. For the NMOS gate to fail, the maximum voltage would have to be close to 0.3V threshold level. Under these conditions, even 1 KOhm resistance would be adequate for a blown fuse, making the fuse application easily extendable for over 100 million fuses in commercial products. If fuse 792 is blown while fuse 791 is intact, the voltage at the thru post 796 becomes 100*Vcc/101~1.58V. Thus the voltage loss is no more than ~15 mV, which is negligible for ~100 mV noise margin circuits.

Figure 8:
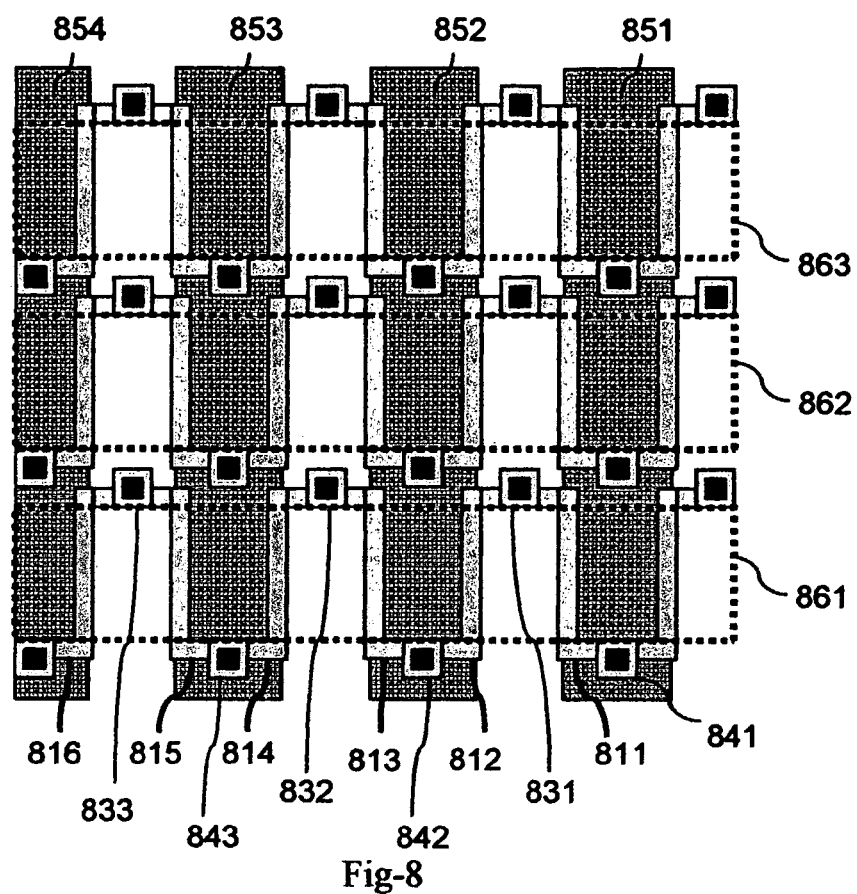
FIG. 8 shows a second embodiment of a laser programmable fuse circuit.

A second embodiment of a laser programmable fuse pattern is shown in FIG. 8. In that two extra metal layers are used to construct thinner and narrower metal fuses 811-816 over the thicker and wider metal bus lines 851-854. In relationship to FIG. 4B, fuses 811-816 are located in module 3, while the bus lines 851-854 are located in module 2. A pair of fuses 811 and 812 couple the thru connect post 831 to bus lines 851 and 852 respectively. Fuse 811 is coupled to post 841 that couples to bus line 851, and fuse 812 is coupled to post 842 which is coupled to bus line 852. Blowing either fuse 811 or 812 allows the regulatory node coupled to thru post 831 to be programmed to one of two digital binary states. Typically these states are chosen to be logic zero at ground voltage, and logic one at power voltage. The voltages could differ from logic power and logic ground values. For example, the digital one could be at an elevated voltage above logic power such that a regulatory node comprised of an NMOS transistor gate electrode could pass the full logic power voltage level without dropping a threshold voltage across the gate. The dual metal fuse arrangement in FIG. 8 has a wider space between the fuses compared to the one metal fuse arrangement shown in FIG. 7A. This allows for larger laser fuse spot size selection to blow the fuses without disturbing the neighboring fuse. The laser beam traverses the center of fuse tracks 861-863 in FIG. 8, blowing the desired fuses. One or more laser beams may traverse these tracks simultaneously allowing a plurality of fuses to be blown to reduce the fuse programming time.

Figure 9:
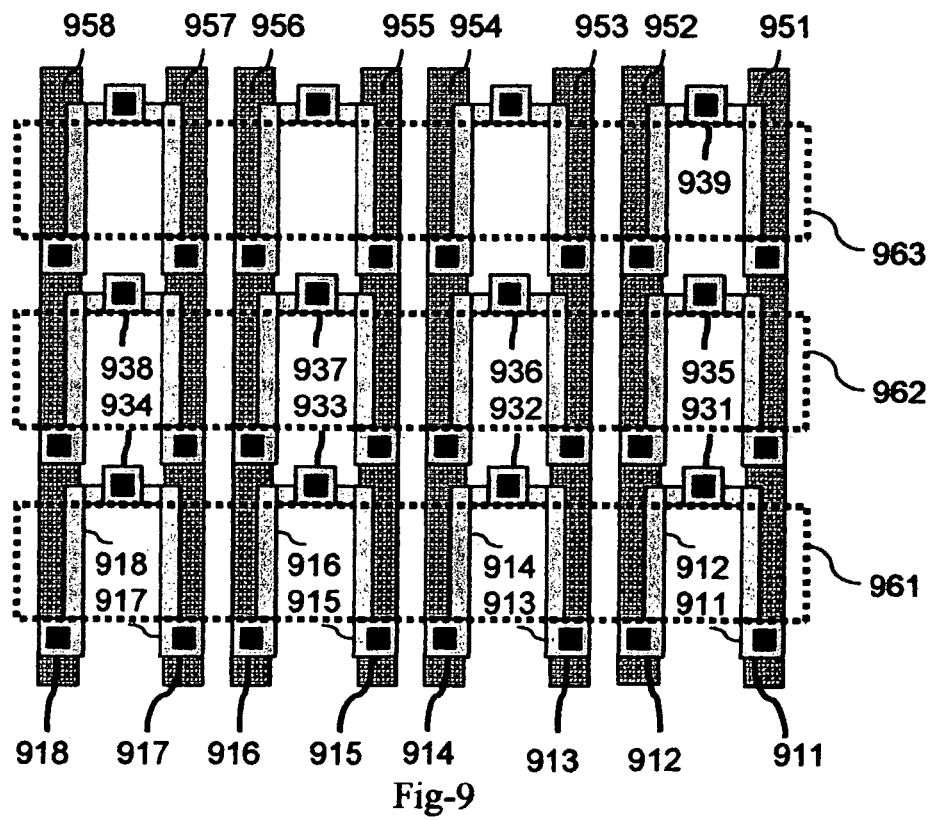
FIG. 9 shows a third embodiment of a laser programmable fuse circuit.

A third embodiment of laser programmable fuses is shown in FIG. 9. The fuse arrangement differs with that in FIG. 8 in the manner in which fuses 911-918 are coupled to bus lines 951-958 (compared to 851-854 in FIG. 8). The bus lines are arranged in pairs such as (951, 952), (953, 954), (955, 956) etc. and each pair creates a fuse bank. For example, the bus lines 951, 952 are coupled to vertical fuse bank comprising fuses 911, 912 but not 913-918. Thru posts 931, 935 & 939 are powered by bus lines 951, 952. When fuses are intact prior to laser programming, the fuse arrangement in FIG. 8 has all the bus lines shorted together by the intact fuses. Hence all bus lines must be either grounded, or held at Vcc for die testing at wafer sort. That gives two bit pattern conditions for test: all zero or all one, which severely restricts test coverage. In FIG. 9, each bank can be individually powered, or groups of banks can be powered. Test vectors can be designed apriori such that the fuses are coupled to these bus line banks to ensure a high level of test coverage. For example, posts 931, 935 & 939 can all be held at zero by grounding bus lines 951, 952 pair, or held at one by applying Vcc to bus lines 951, 952 pair.

Figure 10:
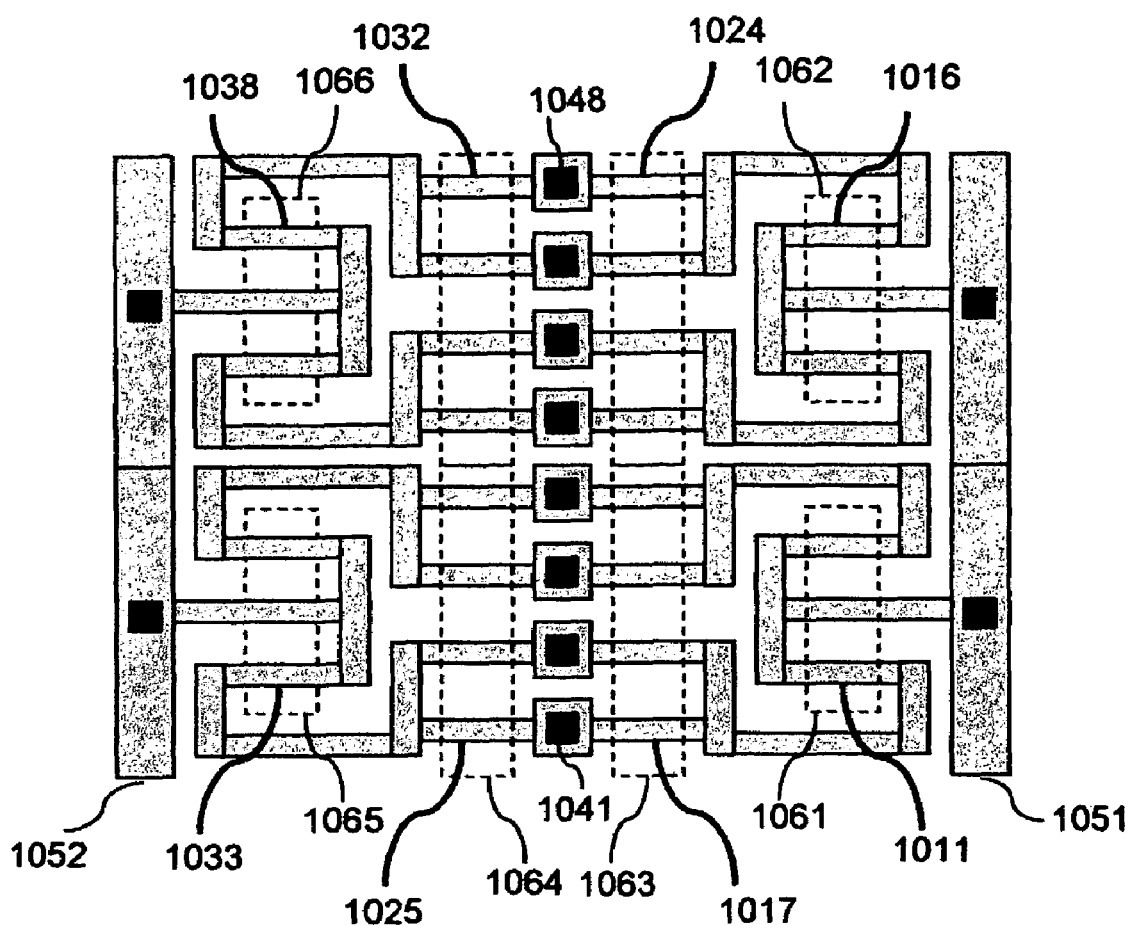
FIG. 10 shows a fourth embodiment of a laser programmable fuse circuit.

A fourth embodiment of laser programmable fuses is shown in FIG. 10. This is constructed as a single metal fuse pattern, wherein the fuses 1011-1038 and bus lines 1051, 1052 are fabricated using the same metal layer. Fuses 1011-1013 are located in fuse window 1061, fuses 1014-1016 are located in fuse window 1062. Similarly fuses 1017-1024 are located in fuse window 1063, and fuses 1025-1032 are located in fuse window 1064. Fuses 1033-1035 and 1036-1038 are located in fuse windows 1065 and 1066 respectively. In FIG. 10, eight thru posts 1041-1048 are shown to connect to the bank of fuses. These posts couple to regulatory nodes in the first module. In one embodiment these regulatory nodes may control a programmable eight to one MUX function. In another embodiment, these regulatory nodes may control inputs to a 3 input look up table function. In yet another embodiment, these regulatory nodes may control other programmable logic functions. In the 8:1 MUX example, only one of the inputs is coupled to the output, hence seven of the control inputs to the MUX are at logic zero, while only one of the inputs is at logic one. The fuse bank is designed to facilitate these instances when a majority of the storage bits hold a logic one or a logic zero state (a preferred state). Let bus 1051 be a ground bus, and bus 1052 be a power bus. If fuse 1012 is blown, all four posts 1041-1044 are coupled to power bus 1052. If fuse 1034 is blown, the four posts 1041-1044 are coupled to ground bus 1051. Thus only one fuse has to be blown to configure four posts to an identical state. Similarly blowing fuse 1011 or 1033 allows posts 1041 and 1042 to be configured to the identical state. If posts 1041 and 1042 are to have opposite polarity, fuse pairs 1017, 1018 or 1025, 1026 are programmed to achieve the desired configuration. The fuse arrangement in FIG. 10 is thus designed to minimize the number of fuses that must be blown to configure logic.

The following terms used herein are acronyms associated with certain manufacturing processes. The acronyms and their abbreviations are as follows:

Vt Threshold voltage
LDN Lightly doped NMOS drain
LDP Lightly doped PMOS drain
LDD Lightly doped drain
RTA Rapid thermal annealing
Ni Nickel
Ti Titanium TiN Titanium-Nitride
W Tungsten
S Source
D Drain
G Gate
ILD Inter layer dielectric
IMD Inter metal dielectric
C1 Contact-1
M1 Metal-1
V1 Via-1
MF Fuse metal
P1 Poly-1
P− Positive light dopant (Boron species, $BF_2$)
N− Negative light dopant (Phosphorous, Arsenic)
P+ Positive high dopant (Boron species, $BF_2$)
N+ Negative high dopant (Phosphorous, Arsenic)
Gox Gate oxide
C2 Contact-2
LPCVD Low pressure chemical vapor deposition
CVD Chemical vapor deposition
ONO Oxide-nitride-oxide
LTO Low temperature oxide
CMP Chemical mechanical polish The digital circuits in module 1 and interconnect and routing in module 2 is fabricated with standard CMOS process technology. CMOS process technology consists of creating NMOS & PMOS logic transistors on a substrate, and interconnect and routing wires above the transistors. The fuse fabrication process sequence is inserted to the standard logic process flow after the top metal in the logic process is covered by either a dielectric or passivation material. An exemplary process sequence to fabricate the 3D FPGA IC is described next. Standard CMOS logic flow up to the dielectric or passivation above top metal is as follows:

P-type substrate
Twin well
Shallow Trench Isolation/CMP
Sacrificial oxide
PMOS Vt mask & implant
NMOS Vt mask & implant
Gate oxidation/Dual gate oxide option
Gate poly (GP) deposition
GP mask & etch
LDN mask & implant
LDP mask & implant
Spacer oxide deposition & etch
Ni deposition
RTA anneal—Ni salicidation (S/D/G regions & interconnect)
Unreacted Ni etch
ILD oxide deposition & CMP
C1 mask & etch
W plug formation & CMP
M1 deposition
M1 mask & etch
IMD oxide deposition & CMP
V1 mask & etch
W plug formation & CMP
Multi layer metallization
Top metal deposition
Top metal mask and etch
Dielectric or passivation deposition In a first embodiment, the special fuse process flow after dielectric/passivation deposition is as follows:
CMP of top passivation
Fuse contact mask and etch
W plug deposition and CMP
MF deposition
MF mask & etch
Top passivation deposition
Pad mask and etch
Anneal In a second embodiment, the special fuse process flow after dielectric/passivation deposition is as follows:
CMP of top passivation
Fuse contact-1 mask and etch
W plug deposition and CMP
MF-1 deposition
MF-1 mask & etch
Dielectric or passivation deposition
CMP of dielectric or passivation
Fuse contact-2 mask and etch
W plug deposition and CMP
MF-2 deposition
MF-2 mask & etch
Dielectric or passivation deposition
Pad mask and etch
Anneal In a third embodiment, the fuse element may comprise an anti-fuse element inserted between two metal lines at the top of the wafer. In yet another embodiment, these fuses may be comprised of carbon nano tubes, or ferroelectric, or electro chemical, or electro magnetic, or any other material that can change electrical characteristics upon receiving an external stimulus. The stimulus may be electrical, magnetic, chemical, optical, radiation, physical, shock-waves, sound waves, vibrations, or of any other means.

During the customization to low cost high volume usage, the fuse-blow path is simply eliminated from production, and the fuse implemented ROM code is defined by a metal mask. This may be simply achieved by customizing the fuse mask MF in the first process option, or the MF2 in the second process option. In another embodiment, the entire special fuse processing steps are eliminated, and the ROM pattern is implementing by a custom mask in the second module (interconnect & routing structure). In this fabrication change from the programmable device comprising fuses, to the custom device comprising the hard-mask, the base die and the mask data in those remaining mask layers do not change. That makes the logistics associated with chip manufacture simple. Removal of the fuse module provides a standard lower cost logic process for the final ASIC with the added benefit of the original smaller die size from the vertical module integration. The circuit timing is unaffected by this migration as lateral metal routing and silicon transistors are untouched. Software tools in the programmable laser product design methodology provide a guaranteed custom mask for the final ASIC solution for the user.

One important parameter for field customization is in the ability for a user to program the device at the application site. Programmability at the wafer manufacturing stage (such as mask programmable devices) or wafer level testing stage (such as traditional laser programming devices) incurs time to solution delay for the user. One embodiment of the present fuse programmable devices is to provide a detachable lid package, wherein the fuses can be programmed by removing the lid. Such a scheme is very useful when the programming method is a laser beam. It is also useful for programming methods employing external energy beams that must impinge on the fuse element to be programmed. Such products may be made reliable by encapsulating the fuse element between two moisture resistant passivation films, and further by using a corrosive resistant material for fuses. Such a material may be Tungsten metal, or any Titanium-Nitride or any other refractory metal. Technologies that share fuses with timing critical wires, or share fuses with product power and ground wires do not have the flexibility to customize the fuses for fuse blow or reliability. Traditional wires and power and ground buses comprise of Aluminum or Copper wires prone to corrosion and difficult to blow. While the prototype devices may be comprised of detachable lids and programmed at the user site, the high volume production units may be programmed at wafer level during test. The latter can be bonded in flip-chip packages and hermatically sealed.

The third module layer containing fuses can be formed as a separate die element and bonded at the thru posts to the second module layer wherein interconnect and routing signals are formed to connect the circuit modules within the first and second module layers. Alternatively, the third module layer can comprise one or more metal layers for fuses and the power and ground rails of the fuses in a separate die element and bonded to the second module layer at the thru posts.

In yet another embodiment of a programmable multi-dimensional semiconductor device, a first module layer is fabricated having a plurality of circuit blocks formed on a first plane. The programmable multi-dimensional semiconductor device also includes a second module layer formed on a second plane comprised of interconnect and routing wires. A third module layer comprised of a plurality of configuration circuits is formed in a third plane to store instructions to control a portion of the circuit modules.

A full disclosure of the digital and configuration modules using a 3D structure is in the incorporated by reference applications. It is summarized here to provide a short overview. The circuit blocks can be a variety of digital or analog circuits. In one embodiment, programmable logic blocks are provided to respond to input data signals. The programmable logic blocks develop corresponding complete or partial output logic signals. Registers are used to store the sequential logic signals and either outputting them to output terminals or returning them as inputs to additional programmable logic blocks. Registers may be programmed out for combinational logic, or modified from JK flip-flops to T-flip flops. The programmable logic block can be selected from one of a pass gate logic, a multiplexer, a truth table logic, or an AND/OR logic. In yet other embodiments, the circuit block contains a RAM/ROM logic block consisting of "logic element tree" or "P-Term logic array" blocks that perform logic functions. In another embodiment, the logic block may be a "logic element" constructed by combining one or more of pass-gate, MUX, truth table, register, and AND/OR array elements.

In another embodiment, the programmable logic block can be a programmable microprocessor block. The microprocessor can be selected from third party IP cores such as: 8051, Z80, 68000, MIPS, ARM, and PowerPC. These microprocessor architectures include superscalar, Fine Grain Multi-Threading (FGMT) and Simultaneous Multi-Threading (SMT) that support Application Specific Packet Processing (ASPP) routines. The processor can contain hardware and software configurability. Programmable features can include varying processor speed, cache memory system and processor configuration, enhancing the degree of Instruction Level Parallelism (ILP), enhancing Thread level parallelism (TLP) and cache partitioning. The processor block can be a Very Long Instruction Word (VLIW) processor to handle multimedia applications and include a cache controller to mange cache allocation.

The programmable logic block can also contain a digital signal processor (DSP), designed to optimize performance for very high speed applications in wireless and fiber-optic networks. The DSP applications can include programmable content for cache partitioning, digital filters, image processing and speech recognition blocks. These real-time DSP applications contain high interrupt rates and intensive numeric computations best handled by hardware blocks. In addition, the applications tend to be intensive in memory access operations, which may require the input and output of large quantities of data. The DSP cache memory may be configured to have "Harvard" or "Modified Harvard" architectures with programmable data memories.

In another embodiment, programmable logic block can contain software programmability. These software functions are executed in DSP, ARM, or MIPS type inserted IP cores, or an external host CPU. Accelerators connected by a configurable SRAM switching matrix enhance the computation power of the processors. The switch matrix is pre-designed to offer both hard-wire and programmable options in the final ASIC.

In yet another embodiment, programmable logic block can be memory such as a register file, cache memory, static memory, or dynamic memory. A register length counter may be programmable in the register file. The cache memory may be programmable to partition between the different requirements of the system design. The memory can also be static random access memory or (SRAM) device with an array of single port, or multi-port addressable memory cells. The memory can also be a smaller dynamic random access memory (DRAM), containing a DRAM controller for refresh and memory management.

In another embodiment, logic block can be an intellectual property ("IP") core, which is usable through licensing from other companies, or taken from prior designs. In core-based design, individual cores may be developed and verified independently as stand-alone modules, particularly when IP core is licensed from external design source. These functions are provided to the user as IP blocks as special hardware blocks or pre-configured programmable logic blocks. The hardware logic block insertion to any position in a logic sequence is done through the configurable logic matrix. These hardware logic blocks offer a significant gate count reduction on high gate count frequently used logic functions, and the user does not require generic "logic element" customization. In both cases, the user saves simulation time, minimize logic gate count, improve performance, reduce power consumption and reduce product cost with pre-defined IP blocks. The switch matrix is replaced by hard-wires in the final ASIC.

The logic block can be an array of programmable analog blocks. In one embodiment, the analog blocks include programmable PLL, DLL, ADC and DAC. In another embodiment, each block contains an operational amplifier, multiple programmable capacitors, and switching arrangements for connecting the capacitors in such as a way as to perform the desired function. Multiple PLL's can be programmed to run at different frequencies on the same chip to facilitate SoC applications requiring more than one clock frequency.

The circuit blocks 104 also contain data fetch and data write circuitry required to configure the configuration circuits 108. This operation may be executed by a host CPU residing in the system, or the PLD device itself During power up, these circuits initialize and read the configuration data from an outside source, either in serial mode or in parallel mode. The data is stored in a predefined word length locally and written to the configurability allocation. The programmed configuration data is verified against the locally stored data and a programming error flag is generated if there is a mismatch. These circuits are redundant in the conversion of the PLD to an ASIC. However, these circuits are used in both FPGA and ASIC for test purposes, and has no cost penalty. A pin-out option has a "disable" feature to disconnect them for the customer use in the FPGA and ASIC.

Turning to the configuration circuits, one embodiment of the configuration circuit includes an array of memory elements. The user configuration of this memory amounts to a specific bitmap of the programmable memory in a software representation.

Suitable memory elements include volatile or non volatile memory elements. In non-volatile memory (NVM) based products, configurable data is held in one of metal link fuse, anti-fuse, EPROM, Flash, EEPROM memory element, or ferro-electric elements. The first two are one time programmable (OTP), while the last four can be programmed multiple times. As EPROM's require UV light to erase data, only Flash & EEPROM's lend to in-system programmability (ISP). In volatile products, the configurable data storage can be SRAM cells or DRAM cells. Additionally, one or more redundant memory cells controlling the same circuit block can be used to enhance device yield.

The components of the memory element array can be a resistor, capacitor, transistor or a diode. In another embodiment of the configuration circuit, a memory element can be formed using thin film deposition. The memory element can be a thin film resistor, thin film capacitor, thin film transistor (TFT) or a thin film diode or a group of thin film devices connected to form an SRAM cell.

This discussion is mostly on fuse elements and can easily extend to include all other programmable elements. In all cases, the design needs to adhere to rules that allow programmable module elimination, with no changes to the base die, a concept not used in PLD, FPGA, Gate Array, ASSP and ASIC products today.

The wiring and/or routing circuit connects each logic block to each other logic block. The wiring/routing circuit allows a high degree of routing flexibility per silicon area consumed and uniformly fast propagation of signals, including high-fanout signals, throughout the device.

One embodiment of a switch matrix is a programmable switch-matrix with SRAM bits, fuses or antifuses. During power-up, a permanent non-volatile memory block located in the system, loads the correct configuration data into SRAM cells. During power-up, fuse devices do not need externally stored memory data. Another embodiment provides short interconnect segments that could be joined to each other and to input and output terminals of the logic blocks at programmable interconnection points. In another embodiment, direct connections to adjacent logic blocks can be used to increase speed. For global signals that traverse long distances, longer lines are used. Segmented interconnect structures with routing lines of varied lengths can be used In yet other embodiments, a hierarchical interconnect structure provides lines of short lengths connectable at boundaries to lines of longer lengths extending between the boundaries, and larger boundaries with lines of even longer length extending between those boundaries. The routing circuit can connect adjacent logic blocks in two different hierarchical blocks differently than adjacent logic blocks in the same hierarchical block. Alternatively, a tile-based interconnect structure can be used where lines of varying lengths in which each tile in a rectangular array may be identical to each other tile. In yet another implementation, the interconnect lines can be separated from the logic block inputs by way of a routing matrix, which gives each interconnect line more flexible access to the logic block inputs.

As discussed above, the process can be modified to fabricate a generic field programmable gate array (FPGA) with the constructed memory circuit or an application specific integrated circuit (ASIC) with the constructed conductive pattern. Multiple ASICs can be fabricated with different variations of conductive patterns. The memory circuit and the conductive pattern have one or more substantially matching logic control characteristics. In this case, FPGA or ASIC timing characteristics are substantially unchanged by the logic control option. The process thus fabricates a programmable logic device by constructing digital circuits on a substrate; and constructing a non-planar circuit on the substrate after constructing the digital circuits, the non-planar circuit being either a memory deposited to store data to configure the digital circuits to form a field programmable gate array (FPGA) or a conductive pattern deposited to hard-wire the digital circuits to form an application specific integrated circuit (ASIC), wherein the deposited memory and the conductive pattern have substantially matching timing characteristics.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A method of fabricating a field programmable integrated circuit comprised of:
    constructing a semiconductor device comprising a fuse circuit to customize the logic content of a programmable logic circuit; and
    attaching said semiconductor device in a detachable lid package, wherein the fuses are customized in the field by detaching the lid and blowing one or more fuse elements.

2. The method of claim 1, further comprised of:
    providing a custom hard-wire pattern in lieu of the fuse circuit, wherein the programmable logic circuit timing is identical between the fuse circuit and hard-wire options.

3. The method of claim 1, further comprised of:
    fabricating digital circuits and said programmable logic circuit on a semiconductor substrate; and
    fabricating interconnect and routing layers above the digital circuits and the programmable logic circuit; and
    fabricating said fuse circuit above the interconnect and routing layers.

4. The method of claim 1, further comprised of:
    coupling each programmable node in the programmable logic circuit to two fuse elements; and
    coupling one of said fuse elements to a logic one rail, and coupling the other of said fuse elements to a logic zero rail, wherein customizing the fuse circuit comprises blowing one or the other of said fuse elements.

5. The method of claim 4, wherein the fuse elements are programmed by one of thermal, electrical, optical, mechanical, magnetic, chemical and vibrational means.

6. The method of claim 4, wherein the fuse elements are programmed by an optical laser beam.

7. The method of claim 4, wherein the fabrication process sequence further comprises:
   forming NMOS and PMOS transistors on a semiconductor substrate;
   depositing above the NMOS and PMOS transistors an interconnect and routing structure comprising one or more metallization modules, each said module further comprised of:
      depositing and polishing an inter metal dielectric layer;
      forming inter metal contact plugs; and
      depositing metal and forming metal tracks;
   depositing an isolation dielectric material and performing CMP to isolate the interconnect and routing structure;
   forming contact plugs to contact the top metal layer in the interconnect structure;
   depositing one or more metal layers comprising a fuse metal layer with desired characteristics for rapid and reliable fuse blow;
   depositing an isolation dielectric material; and
   applying a pad mask and etching pads.

8. A method of forming a programmable semiconductor device comprised of:
   fabricating digital circuits comprising a programmable logic circuit on a substrate;
   fabricating an interconnect and routing structure substantially above the digital circuits; and
   fabricating a programmable fuse circuit above the routing structure to program said programmable logic circuit, wherein the fuse circuit is programmed to store binary data values.

9. The method of claim 8, further comprised of:
   coupling each programmable node in the programmable logic circuit to two fuse elements; and
   coupling one of said fuse elements to a logic one rail, and coupling the other of said fuse elements to a logic zero rail;
   wherein, programming the fuse circuit comprises blowing one or the other of said fuse elements.

10. The method of claim 8, wherein the fuse elements are blown by one of thermal, electrical, optical, mechanical, magnetic, chemical and vibrational means.

11. The method of claim 8, wherein the fuse elements are blown by an optical laser beam.

12. The method of claim 8, wherein the digital circuits and interconnect and routing structure fabrication utilizes a logic process sequence.

13. The method of claim 12, wherein the logic process sequence further comprises:
   forming a P-type substrate;
   creating a twin well;
   developing a shallow trench isolation;
   performing a sacrificial oxide;
   generating a PMOS Vt mask and implant;
   generating a NMOS Vt mask and implant;
   developing gate oxidation;
   depositing gate poly (GP);
   applying the GP mask and etch;
   applying an LDN mask and implant;
   applying an LDP mask and implant;
   depositing a spacer oxide and etching the spacer oxide;
   depositing Nickel;
   performing RTA anneal—Ni salicidation (S/D/G regions & interconnect)
   etching to remove unreacted Nickel;
   depositing ILD oxide and performing CMP;
   applying a C1 mask and etch;
   forming a W plug and performing CMP;
   depositing M1;
   applying a M1 mask & etch; and
   performing back end metallization.

14. The method of claim 8, wherein the programmable fuse fabrication process sequence further comprises:
   depositing an isolation dielectric material and performing CMP to isolate the interconnect and routing structure;
   forming contact plugs to contact the top metal layer in the interconnect structure to the fuse elements;
   depositing one or more metal layers comprising a fuse metal layer with desired characteristics for rapid and reliable fuse blow;
   depositing an isolation dielectric material above the fuse metal; and
   applying a pad mask and etching pads.

15. The method of claim 8, wherein a given fuse blow pattern in the fuse circuit has a corresponding mask configurable conductive pattern in lieu of said fuse circuit, both of which identically program said programmable logic circuit.

16. The method of claim 15, wherein one or more of the digital circuit characteristics comprises a timing characteristic substantially unchanged by the programmable option.

17. The method of claim 8, further comprised of using a bit stream of digital logic one and logic zero generated by a computer aided design automation tool during the place and route phase of custom logic placement and timing optimization to generate the fuse blow pattern.

18. A method of fabricating a programmable integrated circuit comprised of:
   fabricating a packaged semiconductor device comprising only a laser fuse circuit as the top most metal layer to customize the logic content of a programmable logic circuit.

19. The method of claim 18, wherein each programmable node in the logic circuit is coupled to two laser fuse elements, one fuse element coupled to a power bus and the other fuse element coupled to a ground bus.

20. The method of claim 18, wherein the package comprises a detachable lid to remove the lid in the field and blow the fuse elements with an optical laser beam.

* * * * *